(12) United States Patent
Chuang

(10) Patent No.: US 6,894,927 B2
(45) Date of Patent: May 17, 2005

(54) DATA WRITING AND READING METHODS FOR FLASH MEMORIES AND CIRCUITRY THEREOF

(75) Inventor: Mike Chuang, Jhonghe (TW)

(73) Assignee: Leadtek Research, Inc., Taipei Hsien (TW)

( * ) Notice: Subject to any disclaimer, the term of this patent is extended or adjusted under 35 U.S.C. 154(b) by 0 days.

(21) Appl. No.: 10/654,392

(22) Filed: Sep. 2, 2003

(65) Prior Publication Data

US 2004/0085816 A1 May 6, 2004

(30) Foreign Application Priority Data

Nov. 6, 2002 (TW) ........................................ 91132757 A

(51) Int. Cl.[7] .............................................. G11C 11/34
(52) U.S. Cl. ............................. 365/185.11; 365/185.28
(58) Field of Search ....................... 365/185.28, 185.11

(56) References Cited

U.S. PATENT DOCUMENTS

| | | | | |
|---|---|---|---|---|
| 5,799,140 A | * | 8/1998 | Niijima et al. | 714/6 |
| 5,969,986 A | * | 10/1999 | Wong et al. | 365/185.03 |
| 6,002,620 A | * | 12/1999 | Tran et al. | 365/200 |

* cited by examiner

*Primary Examiner*—M. Tran
(74) *Attorney, Agent, or Firm*—Seyfarth Shaw LLP

(57) ABSTRACT

Data writing and reading methods and the implementation circuitry is revealed, in which two flash memories are connected to a data bus in parallel, and two data writing or reading signal lines are respectively electrically connected to each flash memory. The data writing or reading timings of flash memories are controlled by two non-overlapping data writing or reading signals, which may differ from each other by 180°, thereby data can be written into or read from the flash memory so as to increase the data writing and reading efficiencies.

5 Claims, 7 Drawing Sheets

DATA WRITING AND READING METHODS FOR FLASH MEMORIES AND CIRCUITRY THEREOF

BACKGROUND OF THE INVENTION (A) Field of the Invention

The present invention is related to data writing and reading methods for flash memories and circuitry thereof, more specifically, to methods and their implementation circuitry so that data can be written to or read from flash memories in the same time period.

(B) Description of Related Art

These days, the reading speed of a related flash memory product is becoming more rapid. However, the writing speed cannot keep up with the reading speed, so usually the product cannot perform optimally. Because the manner of writing and the related implementation for writing speed enhancement are not standardized yet, employing current standard flash memories is the most feasible way to increase the writing speed.

The methods for enhancing the writing speed of a flash memory or flash memories can be attained by the following methods. First, employing a temporary-save manner, by which data is temporarily saved in a buffer, and the data is not written into a flash memory until the previous data is completely written into the flash memory. The implementation circuitry of the temporary-save manner is shown in FIG. 1(a), the data bus 102 and the data writing signal line 103 of a data recording circuitry 10 are both connected to a flash memory 101. A writing signal WR is inputted into the flash memory 101 to indicate data Da to be written into the flash memory 101 in order. The implementation of such a temporary-save manner needs only one flash memory, but the writing efficiency is not good enough. The second method is by a circulation writing manner; the exemplified implementation circuitry shown in FIG. 1(b). The flash memories 104, 105 of a data recording circuitry 12 are connected with a data bus 106 and a data writing signal line 107 in parallel. Likewise, data also waits to be written while the previous data is written into the flash memories 104, 105. Nevertheless, the two flash memories 104, 105 can be controlled to respectively write data at different timings for improvement of efficiency.

To date, the access speed and programming speed of the flash memories of an USB disk using USB 1.1 are respectively around 20 Mbps and 1 Mbps, but the data transmission speed of the USB is approximately within 1 Mbps to 1.5 Mbps. Therefore, the data transmission speed usually becomes a speed bottleneck of the USB disk. As to a USB 2.0, the data transmission speed ramps up to 60 Mbps, and thus the access speed and programming speed contrarily become a bottleneck to an USB 2.0 disk. By applying the known manners of the temporary-save or the circulation, the speed of the flash memories can be approximately increased by 30%, i.e., the access speed and programming speed of the flash memories respectively increase to 28 Mbps and 13 Mbps.

Although the above-mentioned methods can improve the data writing efficiency of flash memories, which are still limited to the applications of the electronic devices demanding more high data transmission speed, there is still large room for improvement.

SUMMARY OF THE INVENTION

The present invention uses two flash memories integrated with two individual data writing signal lines to decrease the waiting time for data writing, and thus the performance is as the DDR (double data rate) effect of a DRAM. Therefore, the manner of the present invention can approximately double the writing speed compared to that of the prior art.

The data writing and reading methods for flash memories of the present invention use two flash memories in connection with a data bus in parallel, and two data writing or reading signal lines respectively electrically connected to each flash memory. The data writing or reading timings of flash memories are controlled by two non-overlapping data writing or reading signals, which may differ from each other by 180°, thereby data can be written into or be read from the flash memory so as to increase the data writing or reading efficiency.

Accordingly, the writing or reading method can be summarized as comprising the following steps of (1) generating a first data; (2) generating a first data writing or reading signal for writing or reading the first data into or from a first flash memory; (3) generating a second data after the first data writing or reading signal is off; and (4) generating a second data writing or reading signal for writing or reading the second data into or from a second flash memory, in which the first data writing or reading signal and the second data writing or reading signal are non-overlapping.

The data writing circuitry for flash memories of the present invention comprises two flash memories, a data bus and two data writing signal lines, the data bus being electrically connected to each flash memory, and the two data writing signal lines respectively electrically being connected to each flash memory as well. The two data writing signal lines transmit two non-overlapping data writing signals, which may differ from each other by 180°, to control the data writing to the flash memories. Moreover, an 180° phase-shift writing signal may be generated by using an inverter.

Ideally, the data writing method of the present invention can double the writing speed compared to the traditional manner, and a further 20% speed improvement can be obtained by employing data flow processing. As a result, the access speed and programming speed can respectively ramp up to 50 Mbps and 20 Mbps, the instant speed is approximately equivalent to the upper limit of USB2.0, and the average speed is approximately equivalent to the speed of USB1.1 multiplied 20, so the efficiency of the data writing speed of flash memories can be significantly increased.

Although the main objective of the present invention is to increase the data writing speed of flash memories, it can also apply to the data reading of flash memories. In comparison with the data writing circuitry, data reading circuitry is in connection with a data bus in parallel as well, except the two data writing signal lines electrically connected to flash memories are replaced with two data reading signal lines. The data reading timing of flash memories is controlled by two non-overlapping or phase-shifted by 180° reading signals.

DETAILED DESCRIPTION OF THE INVENTION

Figure 1A:
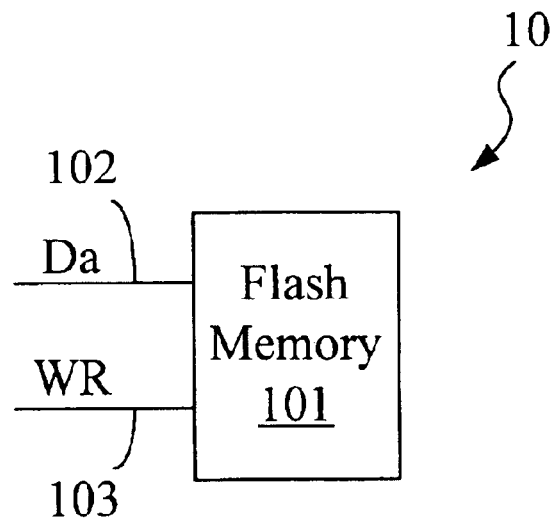
FIG. 1(a) illustrates a known data writing circuitry for a flash memory.
Figure 1B:
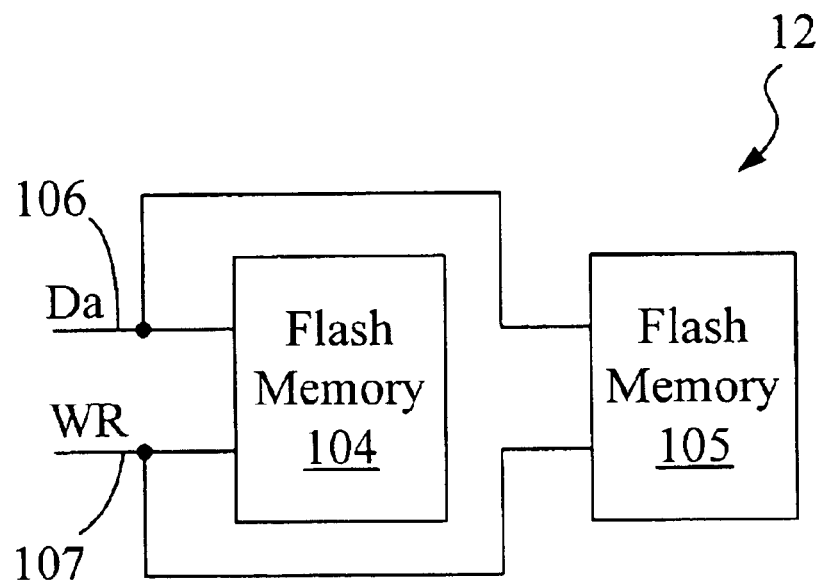
FIG. 1(b) illustrates a known data writing circuitry for flash memories.
Figure 2:
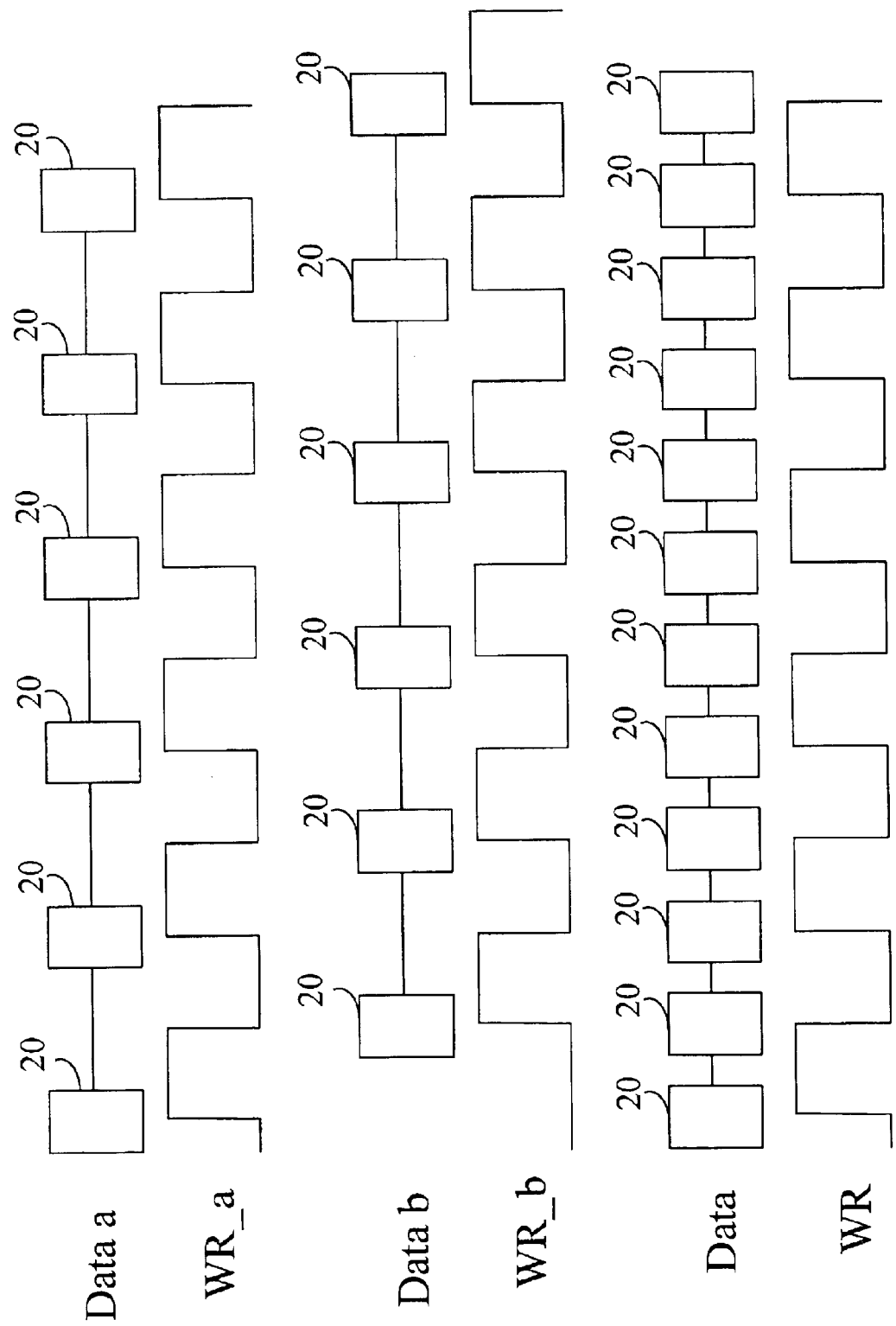
FIG. 2 illustrates the timings of the data writing method in accordance with the present invention.

Referring to FIG. 2, the data writing for flash memories by a known temporary-save or a circulation manner is shown as Data_a. When a data writing signal WR_a switches from a low level to a high level, data 20 is going to be written into the flash memories. Accordingly, data 20 is delayed in being written into the flash memory after the previous data 20 by an interval. The present invention is like adding another Data_b to the Data_a, and the data writing timings are controlled by data writing signals WR_a and WR_b. In accordance with the present invention, the data bus is connected to flash memories in parallel, and the data writing signal lines for transmitting WR_a and WR_b are separate. Integrally, the Data_a is accessed or read at the rising edge of a signal WR, and the Data_b is accessed or read at the descending edge of that. As a result, the intervals between the data 20 can be significantly decreased, and approximately double the data can be written during the same time period, so the writing efficiency can be obviously increased. If each cycle takes 50 ns (nano-second), the data writings of the signals WR_a and WR_b can individually take 25 ns, and keep the same cycle period. To be noted, flash memories are asynchronous devices, so WR_a, WR_b and WR in FIG. 2 are control signals for sampling, not clock signals, so they may be interrupted in the middle.

Figure 3:
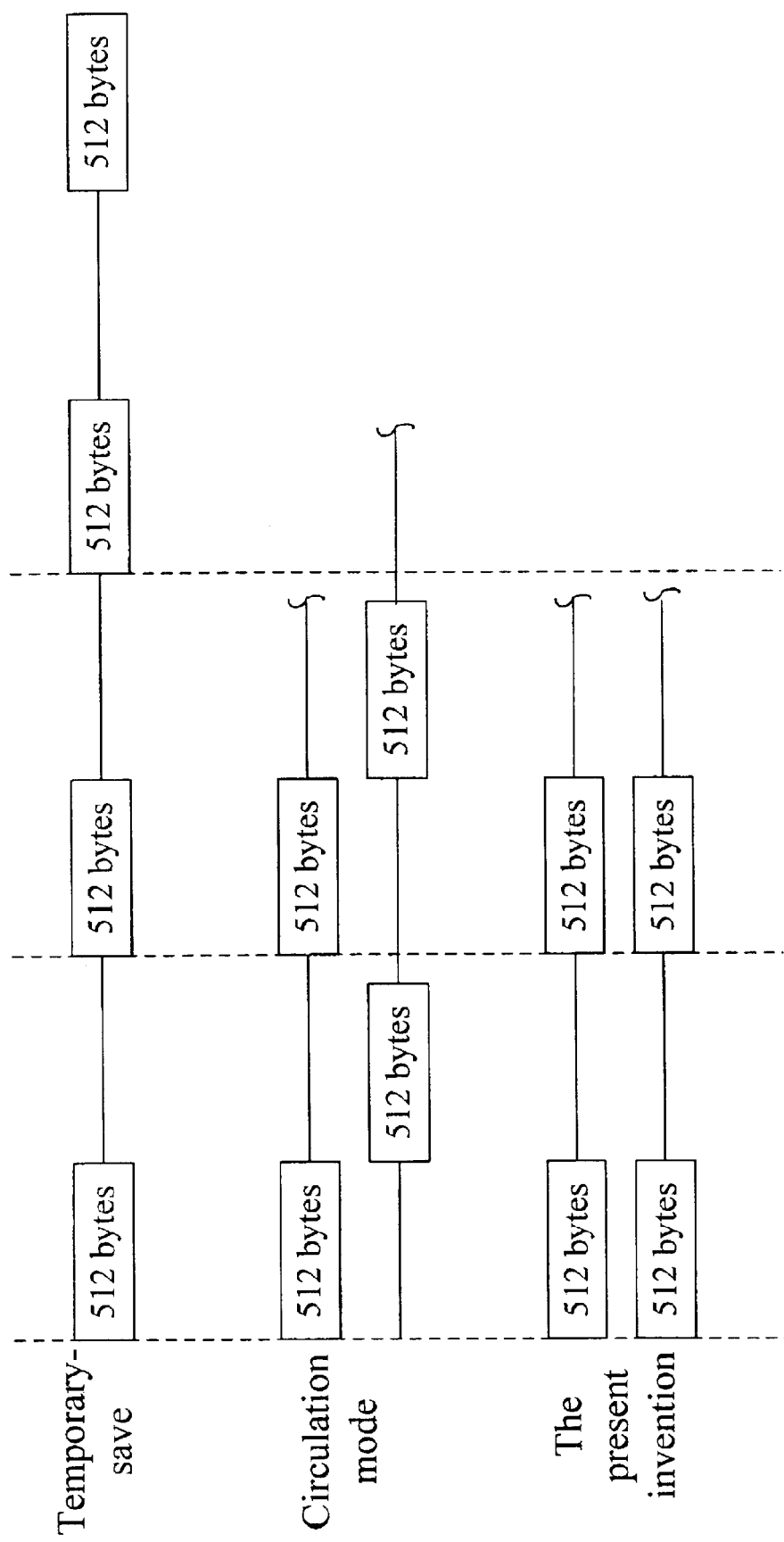
FIG. 3 illustrates the data writing efficiency in comparison with the known methods and the present invention.

FIG. 3 illustrates the comparison of the data writing efficiencies of flash memories by a temporary-save, a circulation mode and the manner of the present invention. For instance, there is 2K bytes of data that needs to be written into flash memories, if 512 bytes data are written a time, i.e., a page volume, the temporary-save manner only needs one flash memory. After 512 bytes of data are inputted, they need a while to be written into the cells of the flash memory by the voltage, and the next 512 bytes will be inputted afterwards. While the data is being written, the flash memory shows "busy" to refuse the next input data. As to the circulation mode, two flash memories are employed. Therefore, even though one flash memory is busy, the next 512 bytes data still can write to the other flash memory without waiting so as to reduce the total writing time. Because the two flash memories are combined with two independent data writing signal lines in accordance with the present invention, 1K bytes data can be divided into two 512 Kbytes of data for being respectively written by the two data writing signal lines, which can nearly perform at the same time, exactly, lagging only 1 byte. If a byte of data needs 50 ns to access or to read, i.e., only 50 ns difference shows at the beginnings of the two data writing signal lines. If the interval between neighboring 512 bytes is 100 ns for recording data into the cells of a flash memory, the "busy" time is 100 μs (micro-second). In the case of recording 2K bytes data, the finish timing of the last 512 bytes in accordance with the present invention is prior to that of temporary-save manner by 2×100 μs+2×512×50 ns. Moreover, in comparison with the circulation mode that also uses two flash memories, the time of 512×50 ns can be saved if the manner of the present invention is employed. Accordingly, if the data is more massive, it is more obvious to differentiate the efficiency improvement of the manner of the present invention.

Figure 4:
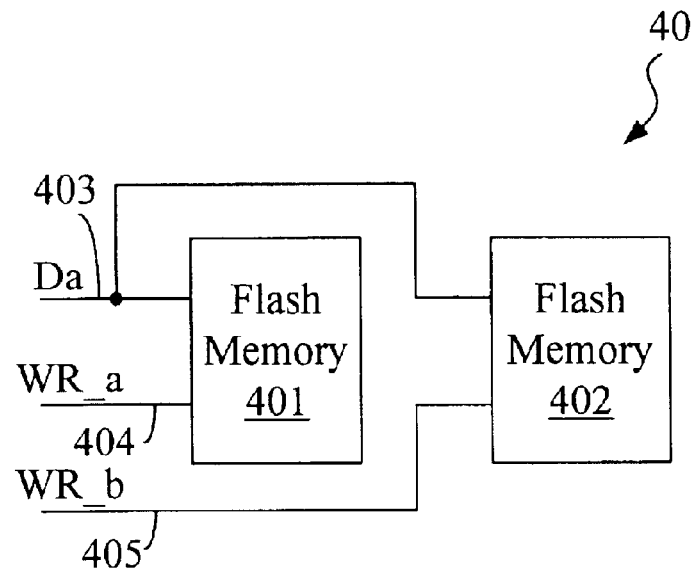
FIG. 4 through FIG. 6 illustrate data writing circuitries for flash memories in accordance with the present invention.

FIG. 4 illustrates a data writing circuitry of flash memories in accordance with the present invention. A data writing circuitry 40 comprises two flash memories 401, 402, a data bus 403 and two data writing signal lines 404, 405, the data writing signal lines 404, 405 being respectively connected to the flash memories 401, 402 to transmit writing signals WR_a and WR_b, and the data bus 403 being connected to the flash memories 401, 402 to transmit data Da.

Besides using two flash memories, the present invention can use more flash memories to increase the data writing efficiency if the data is massive. The application of four flash memories is exemplified as follows.

Figure 5:
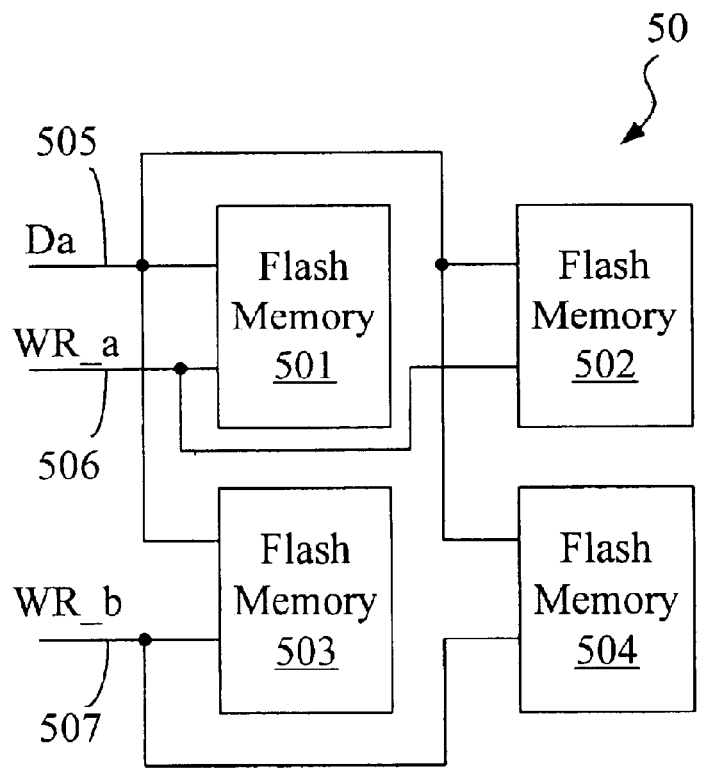

Referring to FIG. 5, a data writing circuitry of a flash memory 50 comprises four flash memories 501, 502, 503, 504, a data bus 505 and two data writing signal lines 506, 507, the data bus 505 being connected to the flash memories 501, 502, 503 and 504 in parallel, the data writing signal line 506 is connected to the flash memories 501 and 502 to transmit the writing signal WR_a, and the data writing signal line 507 is connected to the flash memories 503 and 504 to transmit the writing signal WR_b, thereby data Da can be written into the flash memories 501, 502, 503 and 504 in the same time period.

Figure 6:
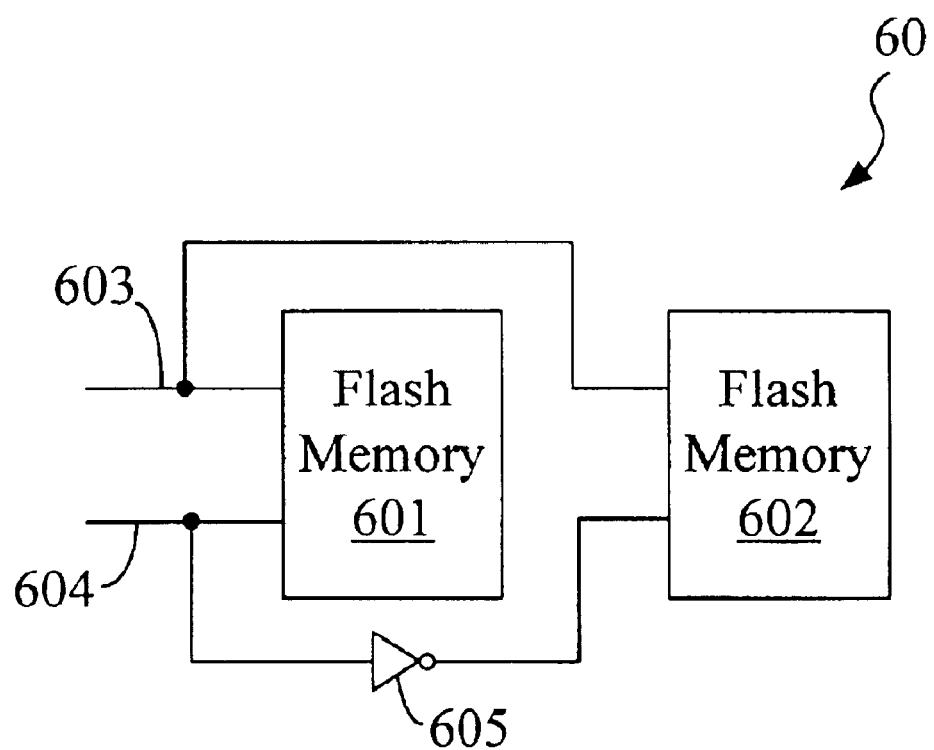

Moreover, an inverter can be used for generating the opposite phase of a writing signal. In FIG. 6, a data writing circuitry 60 for flash memories comprises two flash memories 601, 602, a data bus 603, a data writing signal line 604 and an inverter 605, the data bus 603 being connected to the flash memories 601 and 602 in parallel, and the data writing signal line 604 being also connected to the flash memories 601, 602 in parallel, wherein the inverter 605 is connected in the path to the flash memory 602, so the phases of flash memories 601, 602 are differentiated by 180°.

Figure 7:
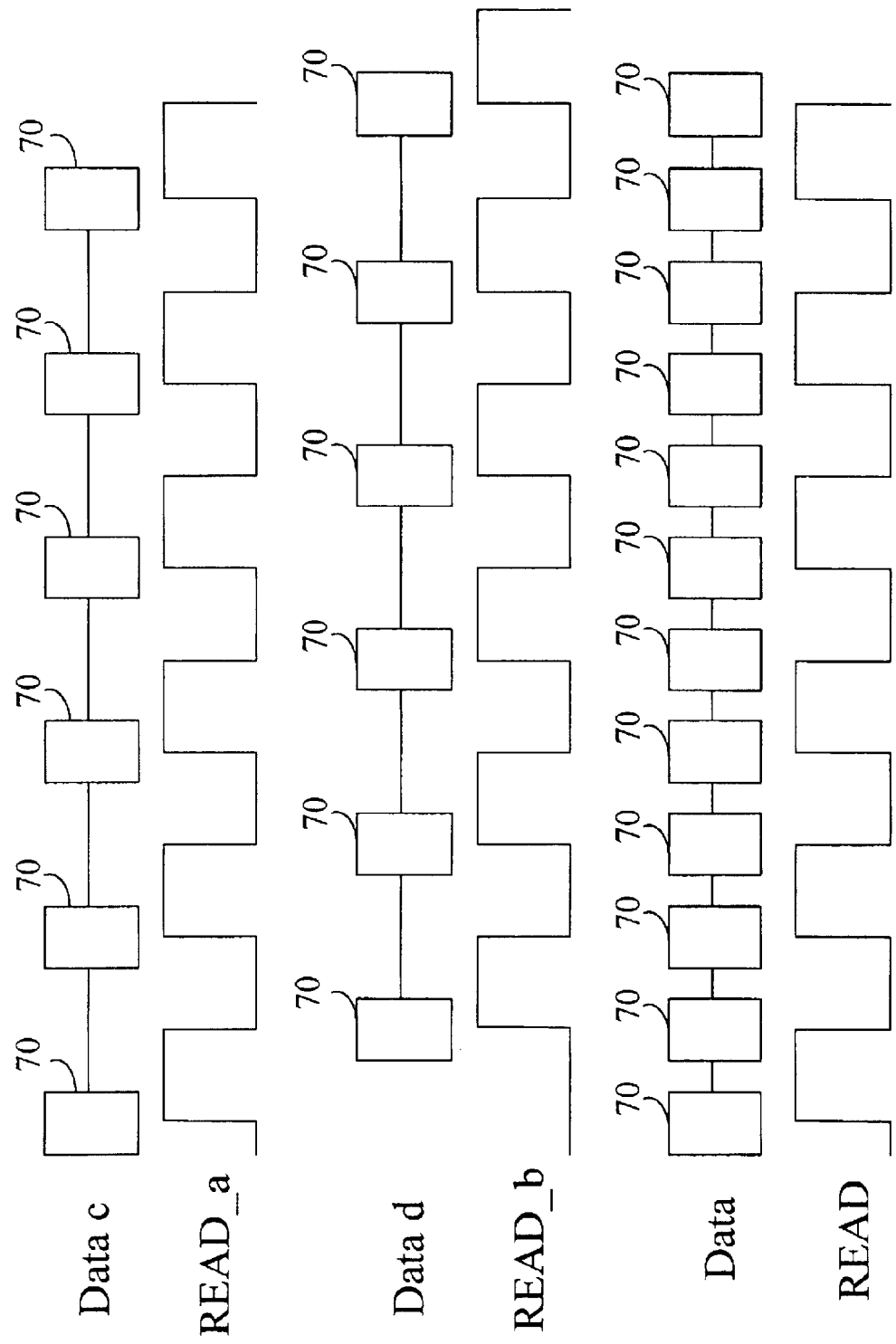
FIG. 7 illustrates the timings of the data reading method in accordance with the present invention.
Figure 8:
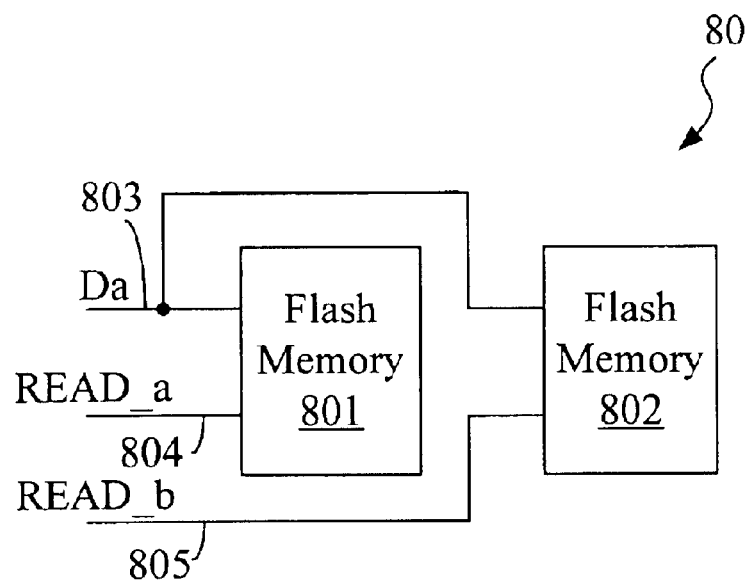
FIG. 8 illustrates a data reading circuitry for flash memories in accordance with the present invention.

Besides being employed for data writing, the manner of the present invention can also apply for data reading. Referring to FIG. 7, in which the WR_a, WR_b and WR in FIG. 2 are respectively replaced by data writing signals READ_a, READ_b and READ, based on the same manner, the data bus of the present invention is connected to flash memories in parallel, and the data writing signal lines for transmitting WR_a and WR_b are separate. Integrally, the Data_c is accessed or read at the rising edge of the signal READ, and the Data_d is accessed or read at the descending edge of that. As a result, the intervals between the data 70 can be significantly decreased, and approximately double the data can be written during the same time period FIG. 8 illustrates a data reading circuitry of flash memories in accordance with the present invention. A data reading circuitry 80 for flash memories comprises two flash memories 801, 802, a data bus 803 and two data reading signal lines 804, 805, the data reading signal lines 804, 805 being respectively connected to the flash memories 801, 802 to transmit reading signals READ_a and READ_b, and the data bus 803 being connected to the flash memories 801, 802 to transmit data Da.

Figure 9:
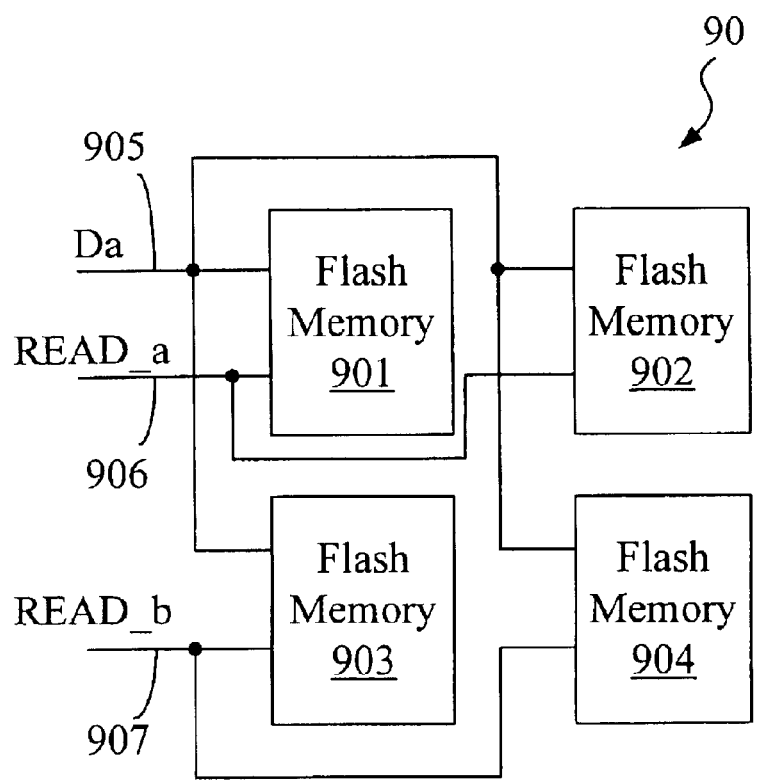
FIG. 9 illustrates another data reading circuitry for flash memories in accordance with the present invention.

FIG. 9 illustrates a data reading circuitry using four flash memories, a data reading circuitry 90 for flash memories comprises four flash memories 901, 902, 903 and 904, a data bus 905 and two data reading signal lines 906, 907, the data bus 905 being connected to the flash memories 901, 902, 903 and 904 in parallel, the data reading signal line 906 is connected to the flash memories 901, 902 to transmit the reading signal READ_a, and the data reading signal line 907 is connected to the flash memories 903, 904 to transmit the reading signal READ_b, thereby data Da can be read from the flash memories 901, 902, 903 and 904 at the same time period.

The above-described embodiments of the present invention are intended to be illustrative only. Numerous alternative embodiments may be devised by those skilled in the art without departing from the scope of the following claims.

What is claimed is:

1. A data writing method for flash memories, comprising the steps of:
   generating a first data;
   generating a first data writing signal for writing the first data into a first flash memory;
   generating a second data after the first data writing signal is off; and
   generating a second data writing signal for writing the second data into a second flash memory, wherein the first data writing signal and the second data writing signal are non-overlapping, and the phase of the second data writing signal differs from that of the first data writing signal by 180°.

2. A data writing circuitry for flash memories, comprising:
   at least two flash memories;
   a data bus electrically connected to the at least two flash memories; and
   two data writing signal lines respectively electrically connected to the at least two flash memories, wherein the data writing signals in the two data writing signal lines are non-overlapping and the phases of the two data writing signals in the two data writing signal lines differ from each other by 180° for respectively writing the data in the data bus into the at least two flash memories.

3. A data writing circuitry for flash memories, comprising:
   two flash memories;
   a data bus electrically connected to the two flash memories;
   a data writing signal line electrically connected to one of the two flash memories; and
   an inverter, wherein the input end of the inverter is connected to the data writing signal line, and the output end of the inverter is connected to the other one of the two flash memories.

4. A data reading method for flash memories, comprising the steps of:
   generating a first data;
   generating a first data reading signal for reading the first data from a first flash memory;
   generating a second data after the first data reading signal is off; and
   generating a second data reading signal for reading the second data from a second flash memory, wherein the first data reading signal and the second data reading signal are non-overlapping and the phase of the second data reading signal differs from that of the first data reading signal by 180°.

5. A data reading circuitry for flash memories, comprising:
   at least two flash memories;
   a data bus electrically connected to the at least two flash memories; and
   two data reading signal lines respectively electrically connected to the at least two flash memories, wherein the data reading signals in the two data reading signal lines are non-overlapping and the phases of the two data reading signals in the two data reading signal lines differ from each other by 180° for respectively reading the data in the data bus from the at least two flash memories.

* * * * *